(12) United States Patent
Kim et al.

(10) Patent No.: US 8,487,679 B2
(45) Date of Patent: Jul. 16, 2013

(54) DATA OUTPUT CONTROL CIRCUIT

(75) Inventors: Ki Han Kim, Gyeonggi-do (KR); Hyun Woo Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 227 days.

(21) Appl. No.: 13/028,253

(22) Filed: Feb. 16, 2011

(65) Prior Publication Data
US 2011/0241742 A1 Oct. 6, 2011

(30) Foreign Application Priority Data

Apr. 6, 2010 (KR) .................. 10-2010-0031386

(51) Int. Cl.
*H03L 7/06* (2006.01)
(52) U.S. Cl.
USPC ........................................ 327/158
(58) Field of Classification Search
None
See application file for complete search history.

(56) References Cited

U.S. PATENT DOCUMENTS

| 6,437,617 | B2 * | 8/2002 | Saeki ............................. 327/158 |
| 6,707,330 | B2 * | 3/2004 | Nakanishi ..................... 327/158 |
| 6,919,745 | B2 * | 7/2005 | Lee et al. ....................... 327/149 |
| 2009/0116313 | A1 | 5/2009 | Jang | |

FOREIGN PATENT DOCUMENTS

| KR | 1020070036561 A | 4/2007 |
| KR | 1020070057467 A | 6/2007 |

* cited by examiner

*Primary Examiner* — Lincoln Donovan
*Assistant Examiner* — Khareem E Almo
(74) *Attorney, Agent, or Firm* — Ladas & Parry LLP (57) ABSTRACT

A data output control circuit includes a DLL circuit and a delay detection unit. The DLL circuit is configured to generate a second internal clock by delaying a first internal clock generated from an external clock, compare a phase of the first internal clock with a phase of the second internal clock, and generate a DLL clock. The delay detection unit is configured to generate a sense signal whose logic level is changed according to a comparison result of a set time interval and a delay time interval during which the first internal clock is delayed in order to generate the second internal clock.

25 Claims, 5 Drawing Sheets

DATA OUTPUT CONTROL CIRCUIT

CROSS-REFERENCES TO RELATED APPLICATIONS

The present application claims priority under 35 U.S.C. 119(a) to Korean Application No. 10-2010-0031386, filed on Apr. 6, 2010, in the Korean intellectual property Office, which is incorporated herein by reference in its entirety set forth in full.

BACKGROUND

Semiconductor memory devices have been continuously improved to increase operating speed as well as integration density. Synchronous memory devices designed to operate in synchronization with a clock provided outside the memory chips are conventionally used to increase the operating speed of semiconductor memory devices.

In typical synchronous memory devices, when data is outputted in synchronization with an external clock, a delay corresponding to an output data access time from clock (tAC) occurs so that a valid data window is reduced. As a result, an error occurs during high frequency operation. Therefore, a delay locked loop (DLL) circuit is used which generates a DLL clock by delaying an external clock by a predetermined time interval (tCK-tAC) in order to output data in exact synchronization with rising and falling edges of a clock. The DLL circuit generates a DLL clock in which a delay component inside a DRAM is adjusted with respect to an external clock in a locking state.

The locking state refers to a state in which a reference clock and a feedback clock are in a synchronized state. A conventional DLL circuit synchronizes a feedback clock with a reference clock by adjusting an initial delay time interval of a delay line upon initial operation.

Figure 1:
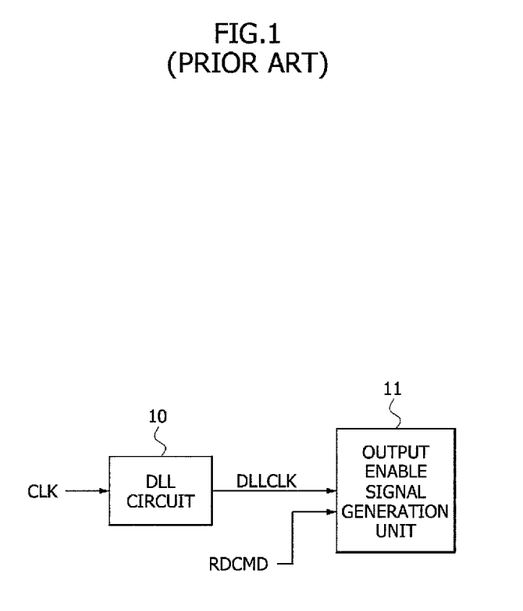
FIG. 1 is a block diagram illustrating a configuration of a conventional data output control circuit.

FIG. 1 is a block diagram illustrating a configuration of a conventional data output control circuit.

As illustrated in FIG. 1, the conventional data output control circuit includes a DLL circuit 10 and an output enable signal generation unit 11. The DLL circuit 10 is configured to receive an external clock (CLK) and generate a DLL clock (DLLCLK). The output enable signal generation unit 11 is configured to generate an output enable signal OE for outputting data in synchronization with the DLL clock (DLLCLK).

This type of conventional data output control circuit continuously operates even when the DLL clock (DLLCLK) is not used, causing unnecessary current consumption.

SUMMARY

Embodiments of the present invention provide a data output control circuit which reduces current consumption and substantially reduces occurrences of a fail during a read operation.

In one embodiment, a data output control circuit includes: a DLL circuit configured to generate a second internal clock by delaying a first internal clock generated from an external clock, compare a phase of the first internal clock with a phase of the second internal clock, and generate a DLL clock; and a delay detection unit configured to generate a sense signal whose logic level transitions according to a comparison result of a set time interval and a delay time interval during which the first internal clock is delayed in order to generate the second internal clock, wherein the DLL circuit controls a DLL clock output operation in response to the sense signal.

In another embodiment, a data output control circuit includes: a clock input buffer configured to receive an external clock and generate a first internal clock; a DLL clock generation unit configured to generate a second internal clock by delaying the first internal clock, compare a phase of the first internal clock with a phase of the second internal clock, and generate a DLL clock; and a delay detection unit configured to generate a sense signal whose logic level is changed according to a comparison result of a set time interval and a delay time interval during which the first internal clock is delayed in order to generate the second internal clock, wherein the clock input buffer controls an operation of generating the first internal clock from the external clock in response to the sense signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 2:
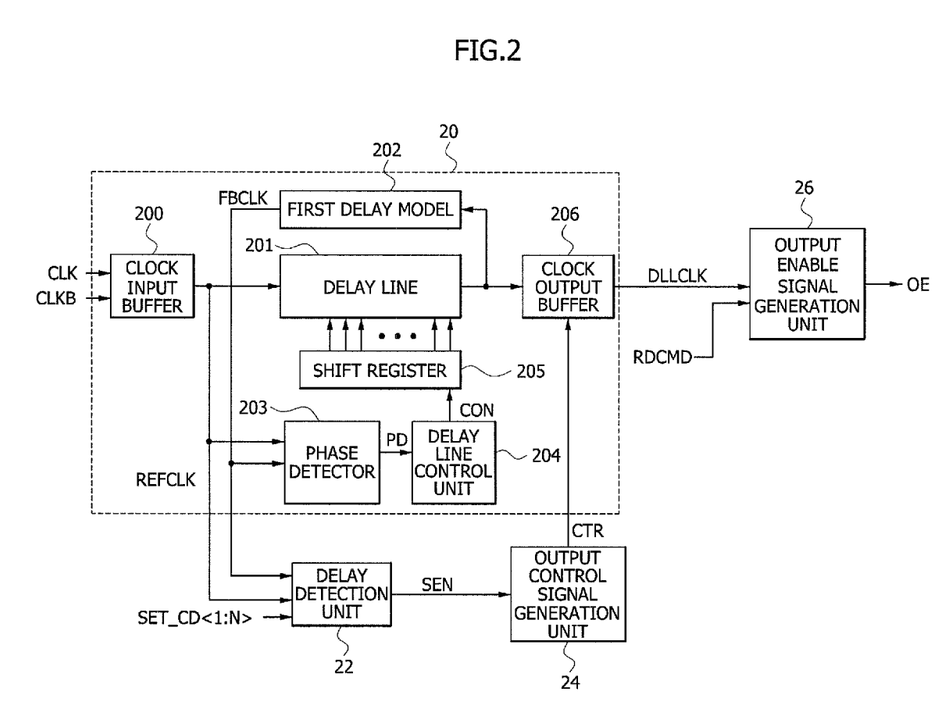
FIG. 2 is a block diagram illustrating a configuration of a data output control circuit according to an embodiment of the present invention.

FIG. 2 is a block diagram illustrating a configuration of a data output control circuit according to an embodiment of the present invention.

As illustrated in FIG. 2, the data output control circuit according to the embodiment of the present invention includes a DLL circuit 20, a delay detection unit 22, an output control signal generation unit 24, and an output enable signal generation unit 26. The DLL circuit 20 is configured to receive an external clock (CLK) and an inverted external clock (CLKB) and generate a DLL clock (CLKDLL). The delay detection unit 22 is configured to receive a code signal (SET_CD<1: N>), delay a first internal clock (REFCLK), and receive a second internal clock (FBCLK). At this time, the delay detection unit 22 is configured to generate a sense signal (SEN) whose logic level is changed according to a comparison result of a set time interval and a delay time interval of the first internal clock (REFCLK). The output control signal generation unit 24 is configured to receive the sense signal (SEN) and generate an output control signal (CTR) for controlling an operation of outputting the DLL clock (DLLCLK) generated from the DLL circuit 20. The output enable signal generation unit 26 is configured to generate an output enable signal OE from a read command (RDCMD) in response to the DLL clock (DLLCLK).

The DLL circuit 20 includes a clock input buffer 200, a delay line 201, a first delay model 202, a phase detector 203, a delay line control unit 204, a shift register 205, and a clock output buffer 206. The clock input buffer 200 is configured to input the external clock (CLK) and the inverted external clock (CLKB) and generate the first internal clock (REFCLK). The delay line 201 is configured to delay the first internal clock (REFCLK) by a set delay amount. The first delay model 202 is configured to generate the second internal clock (FBCLK) by delaying an output signal of the delay line 201 by a predetermined time interval. The phase detector 203 is configured to compare a phase of the first internal clock (REFCLK) with a phase of the second internal clock (FBCLK), and generate a phase detection signal (PD). The delay line control unit 204 is configured to generate a control signal (CON) in response to the phase detection signal (PD). The shift register 205 is configured to adjust the delay amount of the delay line 201 in response to the control signal (CON). The clock output buffer 206 is configured to buffer an output signal of the delay line 201 in response to the output control signal (CTR) and output the DLL clock (DLLCLK).

The DLL circuit 20 having the above-described configuration adjusts the delay amount of the delay line 201 so that the first internal clock (REFCLK) and the second internal clock (FBCLK) achieve a locking state, that is, the first internal clock (REFCLK) and the second internal clock (FBCLK) are synchronized with each other. In addition, the clock output buffer 206 included in the DLL circuit 20 outputs the DLL clock (DLLCLK) when the output control signal (CTR) with a logic high level is inputted, and stops outputting the DLL clock (DLLCLK) when the output control signal (CTR) with a logic low level is inputted.

Figure 3:
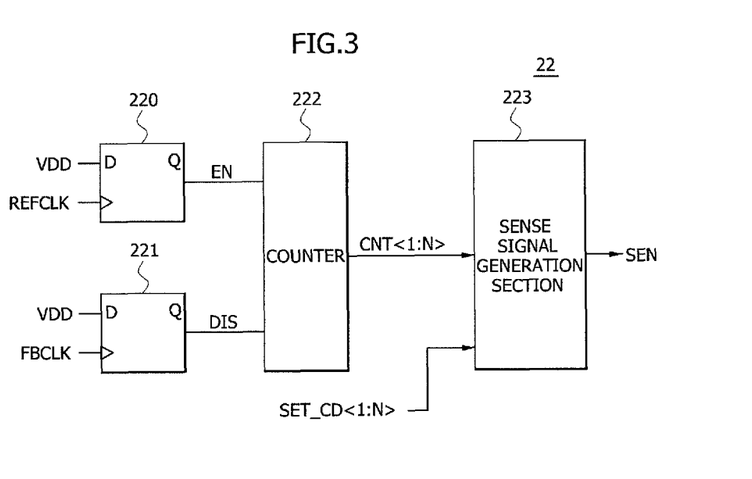
FIG. 3 a diagram illustrating a configuration of a delay detection unit included in the data output control circuit of FIG. 2.

As illustrated in FIG. 3, the delay detection unit 22 includes an enable signal generation section 220, an enable signal generation section 221, a counter 222, and a sense signal generation section 223. The enable signal generation section 220 is implemented with a D flip-flop which outputs a power supply voltage (VDD) as an enable signal (EN) in synchronization with a rising edge of the first internal clock (REFCLK). The enable signal generation section 221 is implemented with a D flip-flop which outputs the power supply voltage (VDD) as a disable signal (DIS) in synchronization with a rising edge of the second internal clock (FBCLK). The counter 222 is configured to perform a counting operation when the enable signal (EN) is at a logic high level, stop the counting operation when the disable signal (DIS) is at a logic high level, and output a counting signal (CNT<1:N>). The sense signal generation section 223 is configured to compare the counting signal (CNT<1:N>) with the code signal (SET_CD<1: N>), and generate the sense signal (SEN). The rising edge of the second internal clock (FBCLK) is generated after the delay time intervals of the delay line 201 and the first delay model 202 from the time when the rising edge of the first internal clock (REFCLK) is generated. In addition, the code signal (SET_CD<1:N>) is set to be equal to the counting signal (CNT<1:N>) counted through the counter 222 during the period from the input of an external read command to the generation of the read command (RDCMD) which is the internal command. Hereinafter, the period is referred to as a "read command margin." The read command (RDCMD) is generated after a set time interval elapses from the input of the external read command.

The delay detection unit 22 having the above-described configuration counts the counting signal (CNT<1:N>) during the delay time intervals of the delay line 201 and the first delay model 202, compares the counting signal (CNT<1:N>) with the code signal (SET_CD<1:N>), and generates the sense signal (SEN). When the delay time intervals of the delay line 201 and the first delay model 202 are larger than the read command margin, the counting signal (CNT<1:N>) is counted more than the code signal (SET_CD<1:N>). Thus, the sense signal (SEN) with a logic low level is generated. On the other hand, when the delay time intervals of the delay line 201 and the first delay model 202 are smaller than the read command margin, the counting signal (CNT<1:N>) is counted less than the code signal (SET_CD<1:N>). Thus, the sense signal (SEN) with a logic high level is generated.

Figure 4:
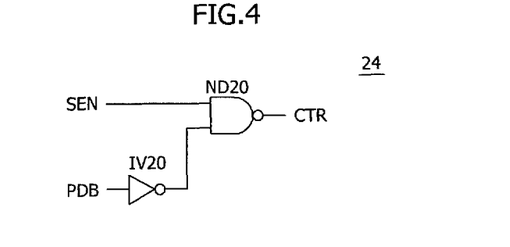
FIG. 4 is a circuit diagram illustrating an output control signal generation unit included in the data output control circuit of FIG. 2 according to a first embodiment of the present invention.
Figure 5:
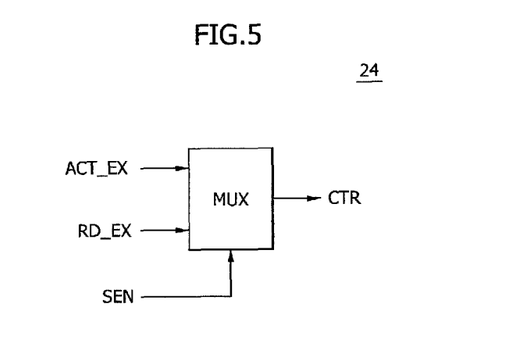
FIG. 5 is a circuit diagram illustrating an output control signal generation unit included in the data output control circuit of FIG. 2 according to a second embodiment of the present invention.

The output control signal generation unit 24 may be implemented with one of circuits illustrated in embodiments of FIGS. 4 and 5.

The output control signal generation unit 24 illustrated in FIG. 4 includes an inverter (IV20) and a NAND gate (ND20). The inverter (IV20) is configured to invert and buffer a power-down mode signal (PDB) with a logic low level in a power-down mode. The NAND gate (ND20) is configured to perform a NAND operation on the sense signal (SEN) and an output signal of the inverter (IV20), and generate the output control signal (CTR). In the modes except for the power-down mode, the output control signal generation unit 24 having the above-described configuration generates the output control signal (CTR) with a logic high level so that the clock output buffer 206 perform an operation of outputting the DLL clock (DLLCLK), regardless of the logic level of the sense signal (SEN). On the other hand, in the power-down mode, the output control signal generation unit 24 inverts and buffers the sense signal (SEN) and outputs the output control signal (CTR).

Meanwhile, the output control signal generation unit 24 illustrated in FIG. 5 includes a multiplexer which outputs an active period signal (ACT_EX) or a read period signal (RD_EX) as the output control signal (CTR) in response to the sense signal (SEN). The output control signal generation unit 24 having the above-described configuration outputs the active period signal (ACT_EX) as the output control signal (CTR) when the sense signal (SEN) is at a logic low level, and outputs the read period signal (RD_EX) as the output control signal (CTR) when the sense signal (SEN) is at a logic high level. The active period signal (ACT_EX) is a signal which is at a logic high level during a period from the input time of an external active command to an end time of an active operation. Hereinafter, the period will be referred to as an "active operation period." The read period signal (RD_EX) is a signal which is at a logic high level during a period from the input time of an external read command to an end time of a read operation. Hereinafter, the period will be referred to as a "read operation period." In some embodiments, the output control signal generation unit 24 illustrated in FIG. 5 may be implemented so that a write period signal with a logic high level is inputted during a write operation period, instead of the read period signal (RD_EX).

Figure 6:
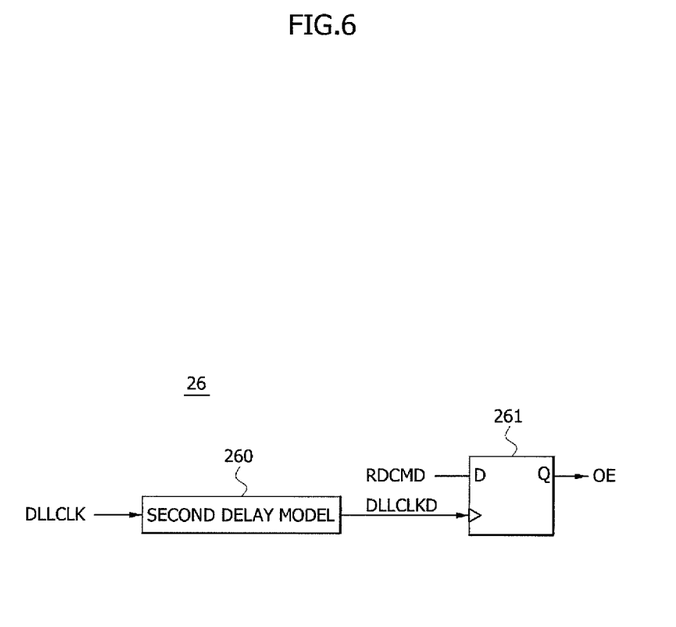
FIG. 6 is a diagram illustrating a configuration of an output enable signal generation unit included in the data output control circuit of FIG. 2.

As illustrated in FIG. 6, the output enable signal generation unit 26 includes a second delay model 260 and an output section 261. The second delay model 260 is configured to generate a delay DLL clock (DLLCLKD) by delaying the DLL clock (DLLCLK) by a predetermined time interval. The output section 261 is implemented with a D flip-flop which outputs the read command (RDCMD) as the output enable signal (OE) in synchronization with the delay DLL clock (DLLCLKD). The delay time interval of the second delay model 260 may be implemented to be substantially equal to the delay time interval of the first delay model 202. Therefore, the delay time intervals of the delay line 201 and the first delay model 202 are substantially equal to the delay time intervals of the delay line 201, the clock output buffer 206, and the second delay model 206. This is because that the delay time interval through the clock output buffer 206 is much smaller than the delay time intervals of the delay line 201, the first delay model 202, and the second delay model 260.

The operation of the data output control circuit having the above-described configuration will be described with reference to FIGS. 2 to 6. Specifically, a case in which the delay time intervals of the delay line 201 and the first delay model 202 are smaller than the read command margin, and a case in which the delay time intervals of the delay line 201 and the first delay model 202 are larger than the read command margin will be described below.

First, the operation of the data output control circuit when the delay time intervals of the delay line 201 and the first delay model 202 are smaller than the read command margin will be described.

The DLL circuit 20 illustrated in FIG. 2 adjusts the delay amount of the delay line 201 so that the first internal clock (REFCLK) and the second internal clock (FBCLK) achieve a locking state, that is, the first internal clock (REFCLK) and the second internal clock (FBCLK) are synchronized with each other.

The delay detection unit 22 illustrated in FIG. 2 receives the first internal clock (REFCLK), the second internal clock (FBCLK), and the code signal (SET_CD<1:N>), and generates the sense signal (SEN). More specifically, referring to FIG. 3, the delay detection unit 22 performs the counting operation during the delay time intervals of the delay line 201 and the first delay model 202, and outputs the counting signal (CNT<1:N>) corresponding to the delay time intervals. Then, the delay detection unit 22 compares the counting signal (CNT<1:N>) with the code signal (SET_CD<1: N>), and generates the sense signal (SEN). When the delay time intervals of the delay line 201 and the first delay model 202 are smaller than the read command margin, the counting signal (CNT<1:N>) is counted less than the code signal (SET_CD<1:N>). Thus, the sense signal (SEN) with a logic high level is generated.

When the output control signal generation unit 24 is implemented with the circuit illustrated in FIG. 4, the output control signal (CTR) is transitioned to a logic low level by the sense signal (SEN) with a logic high level and the power-down mode signal (PDB) with a logic low level in the power-down mode. Therefore, the clock output buffer 206 included in the DLL circuit 20 of FIG. 2 stops outputting the DLL clock (DLLCLK) in the power-down mode. Then, the output enable signal (CTR) is transitioned to a logic high level by the power-down mode that has changed to a logic high level when the power-mode is ended, and the clock output buffer 206 outputs the DLL clock (DLLCLK). The output control signal generation unit 24 operating in the above-described manner stops the DLL clock (DLLCLK) output operation of the clock output buffer 206 in the power-down mode, thereby reducing current consumption.

Meanwhile, when the output control signal generation unit 24 is implemented with the circuit illustrated in FIG. 5, the read period signal (RD_EX) is outputted as the output control signal (CTR) by the sense signal (SEN) with a logic high level. Therefore, the clock output buffer 206 outputs the DLL clock (DLLCLK) during the read operation period.

The output enable signal generation unit 26 illustrated in FIG. 6 generates the delay DLL clock (DLLCLK) by delaying the DLL clock (DLLCLK) by a predetermined time interval, and outputs the read command (RDCMD) as the output enable signal (OE) in synchronization with the delay DLL clock (DLLCLK).

Next, the operation of the data output control circuit when the delay time intervals of the delay line 201 and the first delay model 202 are larger than the read command margin will be described.

The DLL circuit 20 illustrated in FIG. 2 adjusts the delay amount of the delay line 201 so that the first internal clock (REFCLK) and the second internal clock (FBCLK) achieve a locking state, that is, the first internal clock (REFCLK) and the second internal clock (FBCLK) are synchronized with each other.

The delay detection unit 22 illustrated in FIG. 2 receives the first internal clock (REFCLK), the second internal clock (FBCLK), and the code signal (SET_CD<1:N>), and generates the sense signal (SEN). More specifically, referring to FIG. 3, the delay detection unit 22 performs the counting operation during the delay time intervals of the delay line 201 and the first delay model 202, and outputs the counting signal (CNT<1:N>) corresponding to the delay time intervals. Then, the delay detection unit 22 compares the counting signal (CNT<1:N>) with the code signal (SET_CD<1:N>), and generates the sense signal (SEN). When the delay time intervals of the delay line 201 and the first delay model 202 are larger than the read command margin, the counting signal (CNT<1:N>) is counted more than the code signal (SET_CD<1:N>). Thus, a sense signal (SEN) with a logic low level is generated.

When the output control signal generation unit 24 is implemented with the circuit illustrated in FIG. 4, the output control signal (CTR) is generated with a logic high level by the sense signal (SEN) with a logic low level and the power-down mode signal (PDB) with a logic low level in the power-down mode. Therefore, the clock output buffer 206 included in the DLL circuit 20 of FIG. 2 outputs the DLL clock (DLLCLK) even in the power-down mode.

Meanwhile, when the output control signal generation unit 24 is implemented with the circuit illustrated in FIG. 5, the active period signal (ACT_EX) is outputted as the output control signal (CTR) by the sense signal (SEN) with a logic low level. Therefore, the clock output buffer 206 outputs the DLL clock (DLLCLK) during the active operation period.

The output enable signal generation unit 26 illustrated in FIG. 6 generates the delay DLL clock (DLLCLK) by delaying the DLL clock (DLLCLK) by a predetermined time interval, and outputs the read command (RDCMD) as the output enable signal (OE) in synchronization with the delay DLL clock (DLLCLK).

As described above, when the delay time intervals of the delay line 201 and the first delay model 202 are smaller than the read command margin, the data output control circuit according to the embodiment of the present invention stops the operation of the outputting the DLL clock (DLLCLK) in the power-down mode, or outputs the DLL clock (DLLCLK) only in the read operation period, thereby reducing current consumption. Meanwhile, when the delay intervals of the delay line 201 and the first delay model 202 are larger than the read command margin, a fail may occur because the data output control circuit generates the delay DLL clock (DLLCLK) later than the read command (RDCMD). Therefore, the data output control circuit according to the embodiment of the present invention maintains the output of the DLL clock (DLLCLK) even in the power-down mode, or may output the DLL clock (DLLCLK) in the active operation period.

Figure 7:
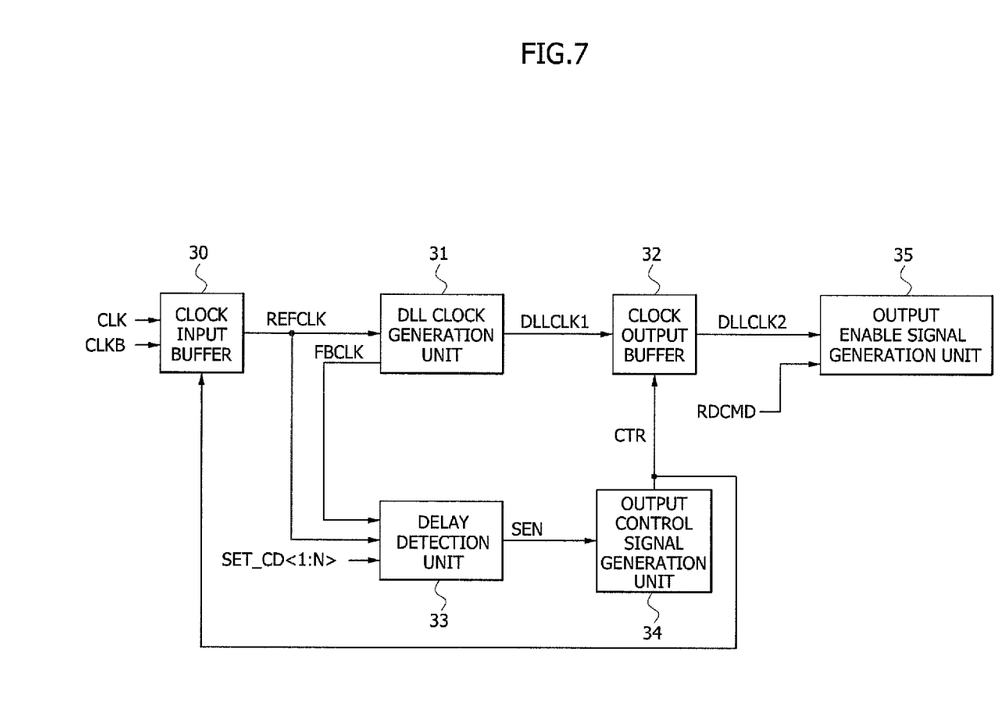
FIG. 7 is a block diagram illustrating a configuration of a data output control circuit according to another embodiment of the present invention.

FIG. 7 is a block diagram illustrating a configuration of a data output control circuit according to another embodiment of the present invention.

As illustrated in FIG. 7, the data output control circuit according to the embodiment of the present invention includes a clock input buffer 30, a DLL clock generation unit 31, a clock output buffer 32, a delay detection unit 33, an output control signal generation unit 34, and an output enable signal generation unit 35. The DLL clock generation unit 31 may be implemented with the same configuration as that of FIG. 2. That is, the DLL clock generation unit 31 may include the delay line 201, the first delay model 202, the phase detector 203, the delay line control unit 204, and the shift register 205 which are included in the data output control circuit of FIG. 2.

Unlike the data output control circuit of FIG. 2, the data output control circuit having the above-described above controls the operations of the clock output buffer 32 and the clock input buffer 30 by using the output control signal (CTR). That is, while the data output control circuit of FIG. 2 controls only the DLL clock (DLLCLK) output operation of the clock output buffer 32, the data output control circuit of FIG. 7 also controls the operation of the clock input buffer 30, thereby further reducing current consumption when the operation is stopped.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data output control circuit comprising:
    a delay locked loop (DLL) circuit configured to generate a second internal clock by delaying a first internal clock generated from an external clock, compare a phase of the first internal clock with a phase of the second internal clock, and generate a DLL clock; and
    a delay detection unit configured to generate a counting signal counted in response to the first internal clock and the second internal clock, compare the counting signal with a code signal corresponding to a set time interval, and generate a sense signal,
    wherein the DLL circuit controls a DLL clock output operation in response to the sense signal.

2. The data output control circuit of claim 1, wherein the delay detection unit comprises:
    an enable signal generation section configured to output an enable signal in synchronization with the first internal clock;
    a disable signal generation section configured to output a disable signal in synchronization with the second internal clock;
    a counter configured to perform a counting operation in response to the enable signal, stop the counting operation in response to the disable signal, and output the counting signal; and
    a sense signal generation section configured to compare the counting signal with the code signal corresponding to the set time interval, and generate the sense signal.

3. The data output control circuit of claim 2, wherein the enable signal generation section is configured to output a power supply voltage as the enable signal in synchronization with a clock edge of the first internal clock, and output the power supply voltage as the disable signal in synchronization with a clock edge of the second internal clock.

4. The data output control circuit of claim 1, wherein the sense signal is generated at a first logic level when the delay time interval is larger than the set time interval, and the sense signal is generated at a second logic level when the delay time interval is smaller than the set time interval.

5. The data output control circuit of claim 4, further comprising an output control signal generation unit configured to generate an output control signal for controlling the DLL clock output operation of the DLL circuit in response to the sense signal.

6. The data output control circuit of claim 5, wherein the output control signal generation unit is configured to generate an output control signal for maintaining the DLL clock output operation of the DLL circuit when the sense signal is at the first logic level in a power-down mode, and to generate an output control signal for stopping the DLL clock output operation of the DLL circuit when the sense signal is at the second logic level in the power-down mode.

7. The data output control circuit of claim 5, wherein the output control signal generation unit is configured to generate an output control signal for maintaining the DLL clock output operation of the DLL circuit when a current mode is not a power-down mode, regardless of the logic level of the sense signal.

8. The data output control circuit of claim 5, wherein the output control signal generation unit is configured to an output control signal for maintaining the DLL clock output operation of the DLL circuit during an active operation period when the sense signal is at the first logic level, and to generate an output control signal for maintaining the DLL clock output operation of the DLL circuit during a read operation period or a write operation period when the sense signal is at the second logic level.

9. The data output control circuit of claim 8, wherein the DLL circuit comprises:
    a first delay model configured to delay an output signal of the delay line by a predetermined time interval;
    a phase detector configured to compare the phase of the first internal clock with the phase of the second internal clock, and generate a phase detection signal;
    a delay line control unit configured to generate a control signal in response to the phase detection signal; and
    a shift register configured to adjust a delay amount in response to the control signal.

10. The data output control circuit of claim 9, further comprising:
    a second delay model configured to generate a delay DLL clock by delaying the DLL clock by a predetermined time interval; and
    an output unit configured to output a read command as an output enable signal in synchronization with the delay DLL clock.

11. The data output control circuit of claim 10, wherein the first delay model and the second delay model have a substantially equal delay time interval.

12. A data output control circuit comprising:
    a clock input buffer configured to receive an external clock and generate a first internal clock in response to a sense signal;
    a DLL clock generation unit configured to generate a second internal clock by delaying the first internal clock, compare a phase of the first internal clock with a phase of the second internal clock, and generate a DLL clock; and
    a delay detection unit configured to generate the sense signal whose logic level is changed according to a comparison result of a set time interval and a delay time interval during which the first internal clock is delayed in order to generate the second internal clock.

13. The data output control circuit of claim 12, wherein the delay detection unit comprises:
an enable signal generation section configured to output an enable signal in synchronization with the first internal clock;
a disable signal generation section configured to output a disable signal in synchronization with the second internal clock;
a counter configured to perform a counting operation in response to the enable signal, stop the counting operation in response to the disable signal, and output a counting signal; and
a sense signal generation section configured to compare the counting signal with a code signal corresponding to the set time interval, and generate the sense signal.

14. The data output control circuit of claim 13, wherein the enable signal generation section is configured to output a power supply voltage as the enable signal in synchronization with a clock edge of the first internal clock, and output the power supply voltage as the disable signal in synchronization with a clock edge of the second internal clock.

15. The data output control circuit of claim 12, wherein the sense signal is generated at a first logic level when the delay time interval is larger than the set time interval, and the sense signal is generated at a second logic level when the delay time interval is smaller than the set time interval.

16. The data output control circuit of claim 15, further comprising an output control signal generation unit configured to generate an output control signal for controlling the operation of the clock input buffer in response to the sense signal.

17. The data output control circuit of claim 16, wherein the output control signal generation unit is configured to generate an output control signal for operating the clock input buffer when the sense signal is at the first logic level in a power-down mode, and to generate an output control signal for stopping the operation of the clock input buffer when the sense signal is at the second logic level in the power-down mode.

18. The data output control circuit of claim 17, wherein the output control signal generation unit is configured to generate an output control signal for operating the clock input buffer when a current mode is not the power-down mode, regardless of the logic level of the sense signal.

19. The data output control circuit of claim 16, wherein the output control signal generation unit is configured to an output control signal for operating the clock input buffer during an active operation period when the sense signal is at the first logic level, and to generate an output control signal for operating the clock input buffer during a read operation period or a write operation period when the sense signal is at the second logic level.

20. The data output control circuit of claim 12, further comprising a clock output buffer configured to buffer the first DLL clock and output the buffered first DLL clock as a second DLL clock.

21. The data output control circuit of claim 20, wherein the sense signal is generated at a first logic level when the delay time interval is larger than the set time interval, and the sense signal is generated at a second logic level when the delay time interval is smaller than the set time interval.

22. The data output control circuit of claim 21, further comprising an output control signal generation unit configured to generate an output control signal for controlling the operations of the clock input buffer and the clock output buffer in response to the sense signal.

23. The data output control circuit of claim 22, wherein the output control signal generation unit is configured to generate an output control signal for operating the clock input buffer and the clock output buffer when the sense signal is at the first logic level in a power-down mode, and to generate an output control signal for stopping the operations of the clock input buffer and the clock output buffer when the sense signal is at the second logic level in the power-down mode.

24. The data output control circuit of claim 23, wherein the output control signal generation unit is configured to generate an output control signal for operating the clock input buffer and the clock output buffer when a current mode is not the power-down mode, regardless of the logic level of the sense signal.

25. The data output control circuit of claim 22, wherein the output control signal generation unit is configured to generate an output control signal for operating the clock input buffer and the clock output buffer during an active operation period when the sense signal is at the first logic level, and to generate an output control signal for operating the clock input buffer and the clock output buffer during a read operation period or a write operation period when the sense signal is at the first logic level.

* * * * *